(12) United States Patent
Ahn

(10) Patent No.: US 6,828,837 B2
(45) Date of Patent: Dec. 7, 2004

(54) LOW POWER FLIP-FLOP CIRCUIT

(75) Inventor: Young-Man Ahn, Yongin (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/670,322

(22) Filed: Sep. 26, 2003

(65) Prior Publication Data
US 2004/0075480 A1 Apr. 22, 2004

(30) Foreign Application Priority Data
Oct. 22, 2002 (KR) .................................. 10-2002-0064666

(51) Int. Cl.$^7$ ........................... H03K 3/289; H03K 3/12
(52) U.S. Cl. ........................ 327/202; 327/211; 327/212
(58) Field of Search .............................. 327/199–203, 327/208–212, 218

(56) References Cited

U.S. PATENT DOCUMENTS 5,859,546 A * 1/1999 Yamauchi ..................... 326/93
6,204,707 B1   3/2001 Hamada et al. ............. 327/202
6,630,853 B1 * 10/2003 Hamada ..................... 327/202

FOREIGN PATENT DOCUMENTS

JP          4-298115     * 10/1992

* cited by examiner

Primary Examiner—Tuan T. Lam
(74) Attorney, Agent, or Firm—Volentine Francos & Whitt, PLLC

(57) ABSTRACT

A flip-flop circuit includes a latch that holds an input signal responsive to an internal clock signal, a comparing circuit that compares the input signal with a latch output to provide a comparison signal, and an internal clock generator that receives an external clock signal and generates an internal clock signal responsive to the comparison signal. The internal clock generating circuit performs a NAND operation on the external clock signal and a delayed inverted version of the external clock signal, to generate the internal clock signal having pulse width smaller than the external clock signal and having rising and falling edges synchronized with the external clock signal. Power consumption is low because the clock buffer and the internal clock generating circuit do not perform switching operations when there is little or no variation in the input signal of the flip-flop.

11 Claims, 5 Drawing Sheets

Transition ratio of the input signal to the clock signal

LOW POWER FLIP-FLOP CIRCUIT

BACKGROUND OF THE INVENTION

1. Field of the Invention

The present invention relates to a flip-flop circuit and, more particularly, to a flip-flop circuit with lower power consumption.

A claim of priority under 35 U.S.C. 119 is made to Korean Patent Application No. 2002-64666 filed on Oct. 22, 2002, the entire contents of which are hereby incorporated by reference.

2. Description of the Related Art

A conventional flip-flop circuit, as shown in FIG. 1, is generally configured to include a clock buffer 110, a master latch gate 120, a master latch 130, a slave latch gate 140, and a slave latch 150. When an internal clock signal CK is a low level, the master latch gate 120 turns on to transfer an input signal D to the master latch 130 and the slave latch gate 140 turns off. To the contrary, when the internal clock signal CK shifts from a low level to a high level, the master latch gate 120 turns off and the input signal D is not transferred to the master latch 130. When the clock signal CK is high level, the slave latch gate 140 turns on and thereby the input signal D, which has been stored in the master latch 130 when the internal clock signal CK is a low level, is transferred to the slave latch 150 that provides an output signal Q through an inverter INV2 therefrom.

In the flip-flop described above, there is no power consumption due to switching during null signal states in the master latch 130 and the slave latch 150 when the input signal does not vary (i.e., the input signal is equal to the output signal). However, even when the input signal does not vary, the clock buffer which receives the external clock signal and generates the internal clock signal from the external clock signal operates. Accordingly, power consumption due to switching in the clock buffer occurs.

Recently, various efforts have been made to reduce power consumption due to switching operations in a clock buffer. FIG. 2 illustrates a conventional flip-flop circuit that reduces the power consumption in the clock buffer. The flip-flop circuit of FIG. 2 has a comparing circuit 220 for comparing the input signal D with the output signal Q, a pulse generating circuit 240 for generating an internal clock signal with a small pulse width in synchronization with the external clock signal, and a control circuit 230 for controlling the output signal PGO of the pulse generating circuit 240 using the comparison result from the comparing circuit 220. When the input signal D does not vary, the power consumption of the flip-flop circuit can be reduced by blocking the path from the pulse generating circuit 240 through the control circuit 230 to the clock buffer 210. However, the flip-flop circuit shown in FIG. 2 includes pulse generating circuit 240, in addition to the circuit part for generating the output signal by synchronizing the input signal with the clock signal. This pulse generating circuit 240 has high power consumption.

FIG. 3 illustrates another conventional type of flip-flop circuit capable of reducing power consumption at the clock buffer, which is disclosed in U.S. Pat. No. 6,204,707. The flip-flop circuit illustrated in FIG. 3 is provided with a comparing circuit 330, an internal clock generating circuit 340, and a latch 320. The flip-flop circuit generates an internal clock signal with a small pulse width in synchronization with the external clock signal CLK, only when the input signal D does not vary. As the flip-flop circuit shown in FIG. 3 does not employ any additional pulse generating circuit, the power consumption thereof is lower than that of the flip-flop circuit shown in FIG. 2. The internal clock generating circuit 340 compares the compared result of the input signal D and the output signal Q, with the external clock signal CLK, to generate an internal clock signal.

However, the internal clock generating circuit 340 is not wholly controlled by way of the comparative difference between the input signal D and the output signal Q. That is, the voltage level of the output terminal of an AND gate 344 is dependent on the external clock signal CLK, and hence, power consumption is caused by operation of the AND gate 344. Furthermore, the start of the internal clock signal (the rising edge of its waveform) at the flip-flop circuit shown in FIG. 3 is synchronized with the external clock signal, and the termination of the internal clock signal (the falling edge of its waveform) is synchronized with the output of the comparing circuit 330. Therefore, with the flip-flop circuit shown in FIG. 3, the pulse width of the internal clock signal is variable in accordance with the operation state of the comparing circuit 330.

SUMMARY OF THE INVENTION

Therefore, an object of the present invention is to provide a flip-flop circuit having reduced power consumption.

To achieve this and other objects, the flip-flop circuit of an embodiment of the invention is provided such that when a variation does not appear at an input signal, an output buffer and an internal clock generating circuit are made not active, thereby reducing power consumption.

According to one aspect of the present invention, the flip-flop circuit includes a latch that receives and holds an input signal under the control of an internal clock signal, a comparing circuit that compares the input signal with the output signal of the latch to provide a compared result, and an internal clock generating circuit that receives an external clock signal and generates an internal clock signal under the control of the output signal of the comparing circuit. The internal clock generating circuit controls an entrance path and passing of the external clock signal using the output signal of the comparing circuit, delays the external clock signal for a predetermined time and inverts the delayed external clock signal. The internal clock generating circuit generates an internal clock signal with a pulse width smaller than the pulse width of the external clock signal by means of a NAND operation performed on the external clock signal and the inverted delayed external clock signal. The internal clock signal is established with rising and falling edges all synchronized with the external clock signal.

The internal clock generating circuit includes an inverter that inverts the output signal of the comparing circuit from a first node and transmits the inverted signal to a second node, and a transmission gate with a first input terminal connected to the first node and a second input terminal connected to the second node that receives the external clock signal and transmits the received signal to a third node. The internal clock generating circuit further includes a PMOS transistor having a source terminal connected to a supply voltage, a gate terminal connected to the second node, and a drain terminal connected to the third node. A delay circuit receives a signal from the third node, and delays the external clock signal for the predetermined time and inverts the delayed external clock signal. A NAND circuit receives the delayed inverted external clock signal, and performs the NAND operation on the external clock signal and the delayed inverted external clock signal.

In an aspect of the embodiment, the delay circuit is formed of odd-numbered inverters. Also, in the internal clock generating circuit, the PMOS transistor maintains the third node at a high level when the transmission gate turns off.

BRIEF DESCRIPTION OF THE DRAWINGS

The above and other objects and features of the present invention will become more apparent from the following description of the preferred embodiments thereof made with reference to the accompanying drawings in which.

DETAILED DESCRIPTION OF THE PREFERRED EMBODIMENTS

Figure 4:
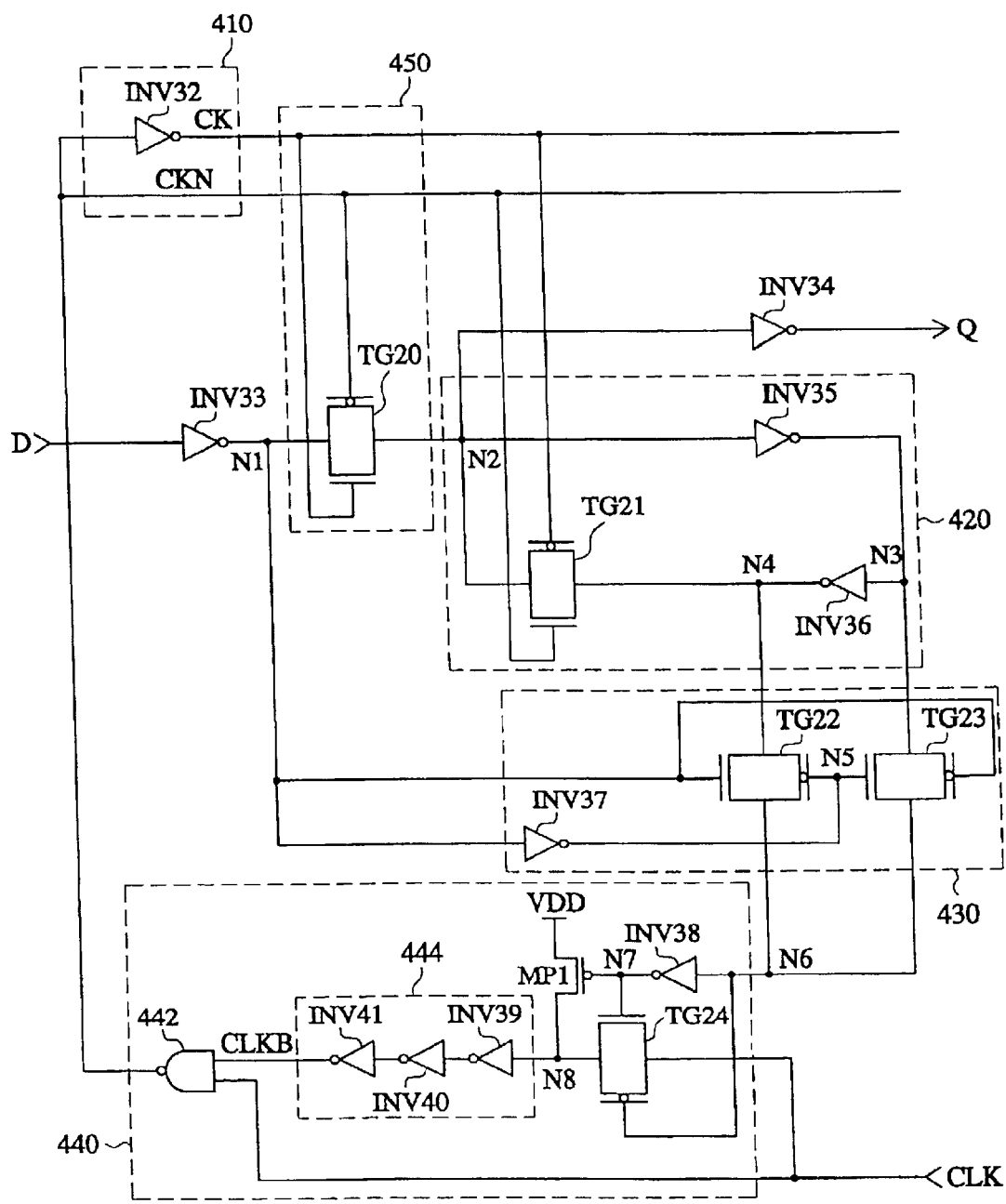
FIG. 4 is a circuit diagram of a flip-flop circuit according to an embodiment of the present invention, with lower power consumption at the clock buffer therein.

A low power flip-flop circuit according to an embodiment of the present invention is illustrated in FIG. 4. The flip-flop circuit includes a first inverter INV33 for inverting the input signal D and outputting the inverted signal to a first node N1, and a latch gate 450 for receiving the signal from the first node N1 and transmitting the received signal to a second node N2 under the control of the internal clock signal CK and the inverted internal clock signal CKN. A latch 420 latches the signal at the second node N2 under the control of the internal clock signal CK and the inverted internal clock signal CKN. A second inverter INV34 receives and inverts the signal at the second node N2 to generate the output signal Q. A comparing circuit 430 compares the signal at the first node N1 with the output signal of the latch 420, and outputs a comparison result to a sixth node N6. An internal clock generating circuit 440 receives the external clock signal CLK, and generates an inverted internal clock signal CKN under the control of the signal at the sixth node N6. A clock buffer 410 receives the inverted internal clock signal CKN, and generates an internal clock signal CK.

The latch gate 450 is formed as including a transmission gate TG20, and the clock buffer 410 is formed as including an inverter INV32.

The latch 420 includes a third inverter INV35 for inverting the signal at the second node N2 and outputting the inverted signal to a third node N3, a fourth inverter INV36 for inverting the signal at the third node N3 and outputting the inverted signal to a fourth node N4, and a first transmission gate TG21 for receiving the signal at the fourth node N4 and outputting the received signal to the second node N2 under the control of the internal clock signal CK and the inverted internal clock signal CKN.

The comparing circuit 430 includes a fifth inverter INV37 for inverting the signal at the first node N1 and outputting the inverted signal to a fifth node N5; a third transmission gate TG23, having a first input terminal receiving the signal at the first node N1 and a second input terminal receiving the signal at the fifth node N5, that receives the signal at the third node N3 and transmits the received signal to a sixth node N6; and a second transmission gate TG22, having a first input terminal receiving the signal at the fifth node N5 and a second input terminal receiving the signal at the first node N1, that receives the signal at the fourth node N4 and transmits the received signal to the sixth node N6.

The internal clock generating circuit 440 includes a sixth inverter INV38 for inverting the signal at the sixth node N6 and transmitting the inverted signal to a seventh node N7; a fourth transmission gate TG24, having a first input terminal connected to the sixth node N6 and a second input terminal connected to the seventh node N7, that receives the external clock signal CLK and transmits the received signal to an eighth node N8; a PMOS (P-type Metal Oxide Semiconductor) transistor MP1 having a source terminal connected to the supply voltage VDD, a gate terminal connected to the seventh node N7 and a drain terminal connected to the eighth node N8; a delay circuit 444 for delaying the signal at the eighth node N8 by a predetermined time and inverting the signal to output the delayed and inverted external clock signal CLKB; and a NAND circuit 442 for receiving the external clock signal CLK and the delayed and inverted external clock signal CLKB, and performing a NAND operation on the signals. The delay circuit 444 includes an odd number of inverters INV39 to INV41.

Figure 5:
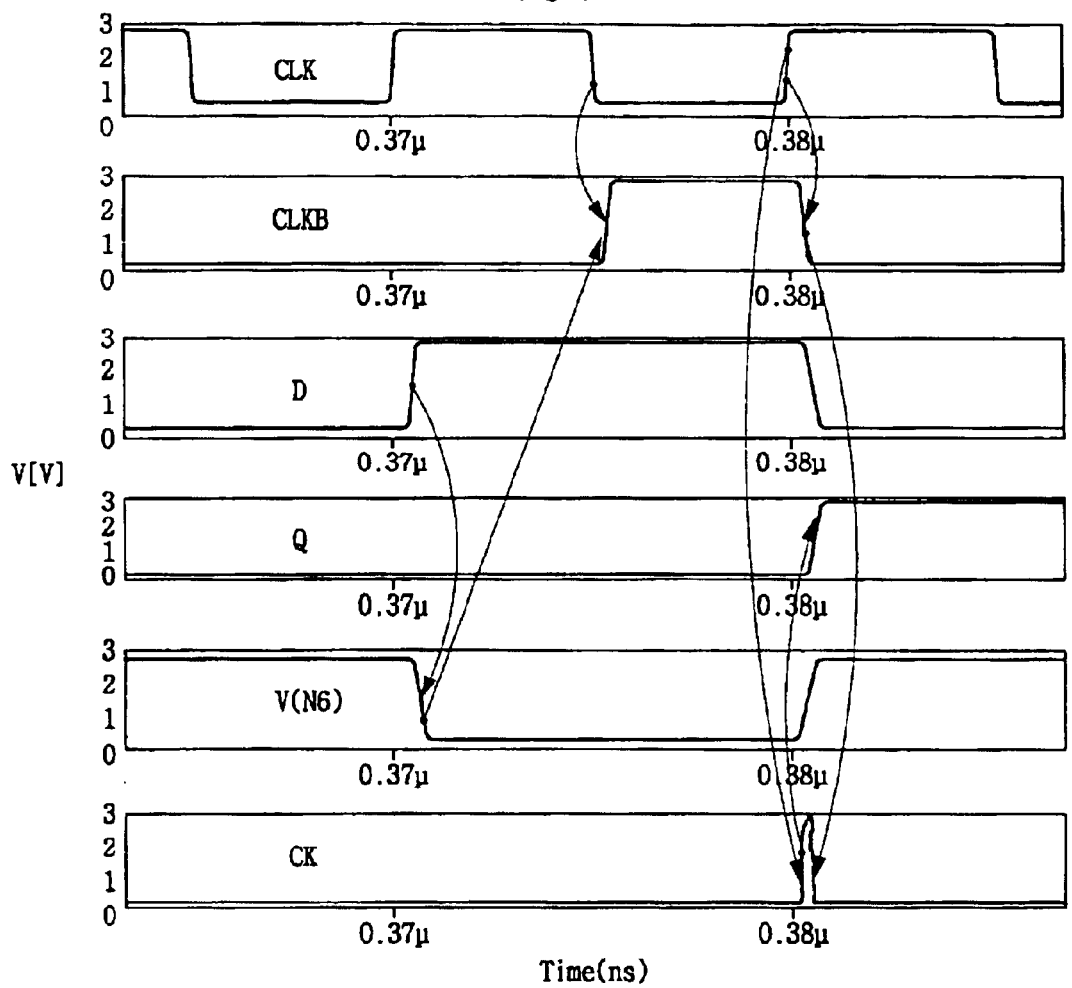
FIG. 5 is a timing diagram illustrating the operation of the circuit shown in FIG. 4.

The operation of the low power flip-flop circuit according to an embodiment of the present invention will be now explained with reference to FIG. 4 and the timing diagram as illustrated in FIG. 5.

When the internal clock signal CK is at a high level, the latch gate 450 turns on, and the signal at the first node N1 which corresponds to the input signal D as inverted, is transmitted to the latch 420. When the input signal D is at a high level, the signals at the first and the second nodes N1 and N2 become low level, and the output signal Q of the flip-flop becomes a high level. At this time, the signal at the third node N3 goes to a high level which is the same as the output signal Q of the flip-flop, and the signal at the fourth node N4 goes to a low level. As the internal clock signal CK is at a high level, the first transmission gate TG21 turns off. The PMOS transistor MP1 sets the eighth node N8 to be at a high level when the fourth transmission gate TG24 turns off.

If the input signal D remains at a high level without variation, the third transmission gate TG23 turns on and the second transmission gate TG22 turns off. As the third node N3 maintains a high level, the third transmission gate TG23 outputs a high-level signal to the sixth node N6. As a signal from the seventh node N7 becomes a low level, the fourth transmission gate TG24 turns off and the PMOS transistor MP1 turns on. Then, a voltage level of the eighth node N8 goes to a high level. The delayed external clock signal CLKB, which is output from the delay circuit 444, becomes a low level. If a variation is not made to the input signal D of the flip-flop, the level of the sixth node N6, which is the output signal of the comparing circuit 430, constantly is maintained at a high level and the output of the NAND gate 442 maintains a high level. At this time, the inverted internal clock signal CKN becomes a high level, and the internal clock signal CK becomes a low level. As a result, when there is no variation of the input signal D of the flip-flop, the clock buffer 410 does not carry out a switching operation and the semiconductor elements in the internal clock generating circuit 440 are shut off. Therefore, when there is no variation of the input signal D to the flip-flop, the power consumption due to the switching operation generated at the clock buffer 410 and the internal clock generating circuit 440 is greatly reduced.

In the state that the input signal D and the output signal Q are a state of high level, if the input signal D goes to a state of low level, output signal Q goes to a low level, the second transmission gate TG22 of the comparing circuit 430 turns on, and the third transmission gate TG23 turns off. As the signal at the third node N3 of the latch 420 still maintains a high level and the signal at the fourth node N4 is at a low level, the second transmission gate TG22 transfers the low-level signal to the sixth node N6. As the signal of the seventh node N7 goes to a high level, the fourth transmission gate TG24 turns on and the PMOS transistor MP1 turns off. Accordingly, the external clock signal CLK, and the external clock signal CLKB delayed and inverted by the delay circuit 444, are applied to the NAND gate 442. At this time, the output signal of the internal clock generating circuit 440 is configured to be a pulse signal with a pulse width smaller than that of the external clock signal CLK. When the external clock signal CLK shifts from a low level to a high level, the rising edge of the output signal of the NAND gate 442 is provided. When the external clock signal CLKB delayed by the delay circuit 444 shifts from a high level to a low level, the falling edge of the output signal of the NAND gate 442 is formed. The output signal of the NAND gate 442 acts as the inverted internal clock signal CKN, and the output of the clock buffer 410 formed with the inverter INV32 acts as the internal clock signal CK. FIG. 5 is a timing diagram illustrating the process of generating the internal clock signal.

As described above, the rising and the falling edges of the internal clock signal CK in the inventive low power flip-flop circuit are all synchronized with the external clock signal CLK.

Table 1 comparatively summarizes the power consumption rates in 8-bit counters constructed with the flip-flop circuits shown in FIGS. 1 to 4. In Table 1, the marked values are each measured at bit positions of the 8-bit counters under the condition of 100 MHz-frequency operation and 3.3V-supply voltage, and indicate power consumption in terms of uW for transition ratios of the input signal to the clock signal of 1, ½, ¼ . . . ¹⁄₁₂₈.

TABLE 1

Figure 1:
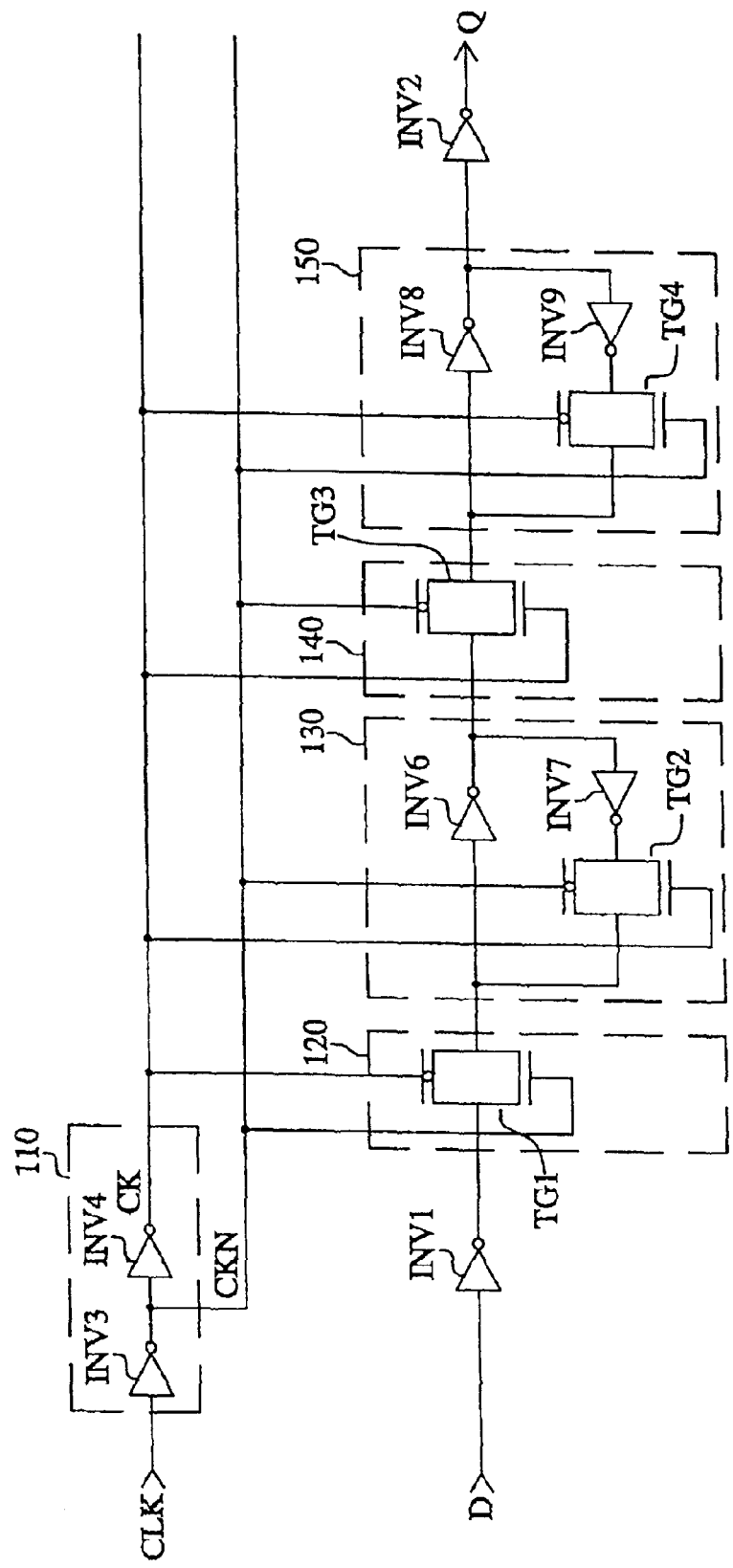
FIG. 1 is a circuit diagram of a conventional flip-flop circuit.
Figure 2:
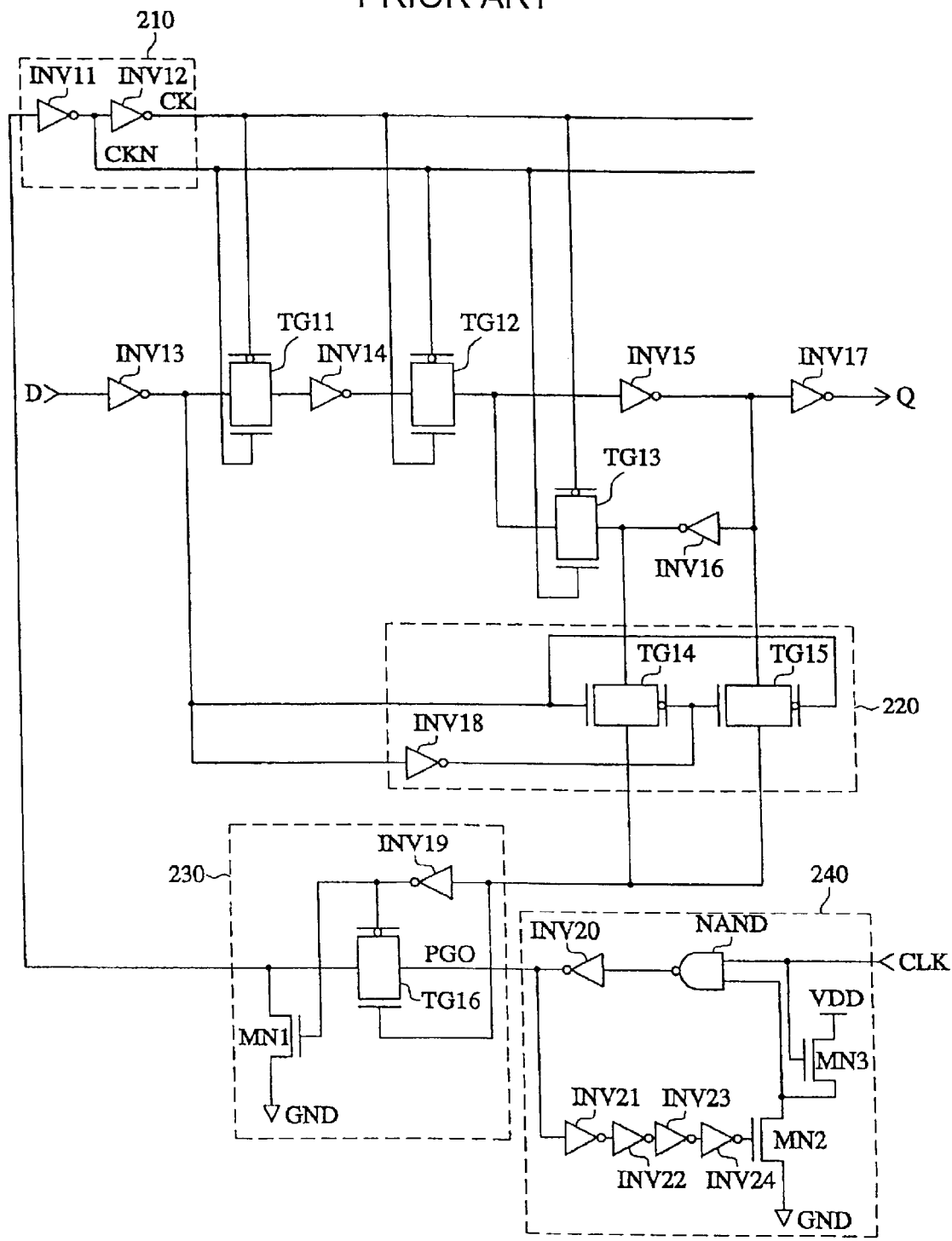
FIG. 2 is a circuit diagram of a conventional flip-flop circuit having reduced power consumption at the clock buffer therein.
Figure 3:
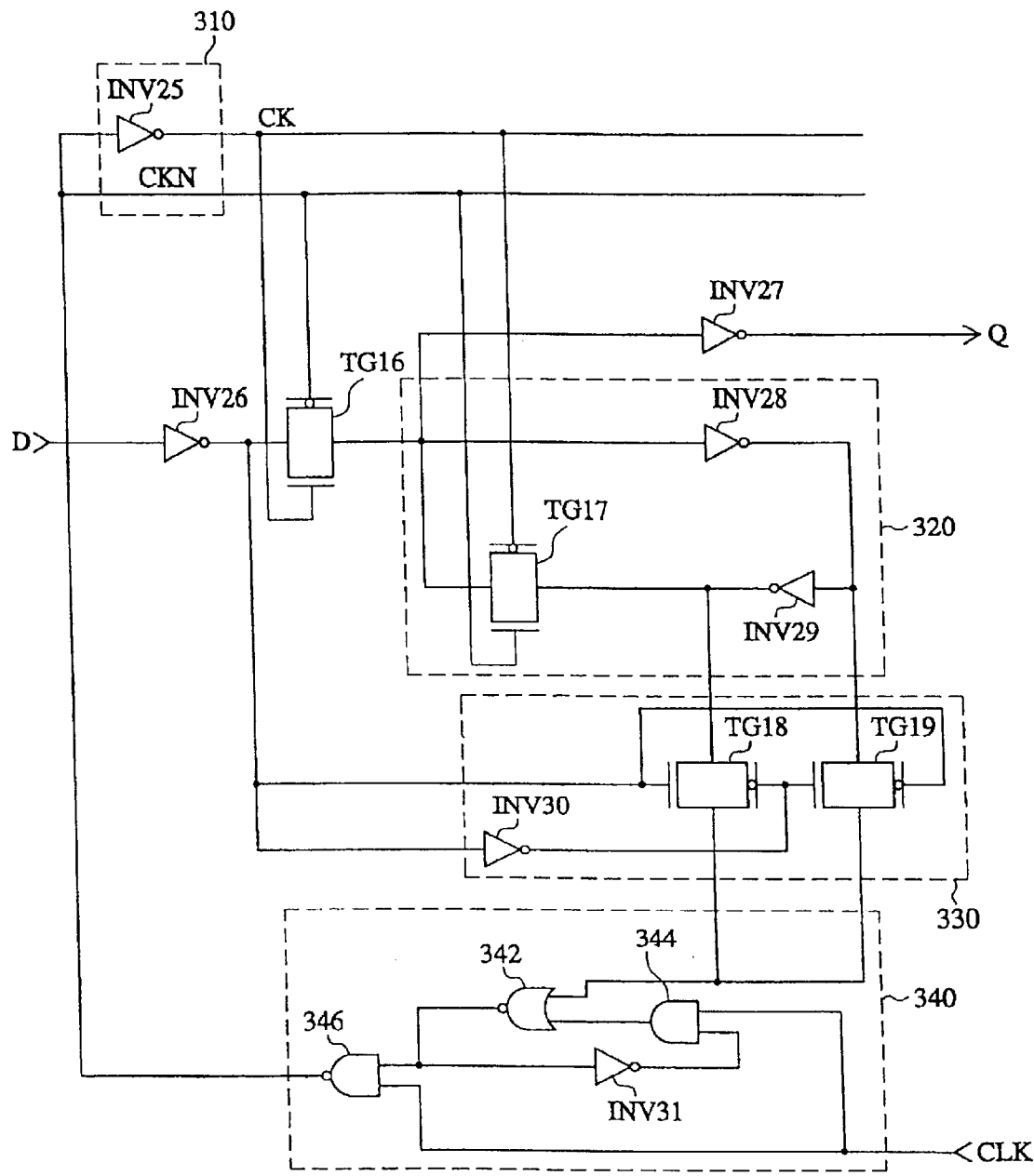
FIG. 3 is a circuit diagram of another conventional flip-flop circuit having reduced power consumption at the clock buffer therein.

|  | The circuit of FIG. 1 | The circuit of FIG. 2 | The circuit of FIG. 3 | The circuit of FIG. 4 |
| --- | --- | --- | --- | --- |
| 1 | 158 | 269 | 233 | 214 |
| 1/2 | 111 | 156 | 128 | 107 |
| 1/4 | 88 | 100 | 81 | 55 |
| 1/8 | 76 | 71 | 57 | 28 |
| 1/16 | 70 | 56 | 44 | 14 |
| 1/32 | 68 | 49 | 39 | 8 |
| 1/64 | 66 | 46 | 35 | 4 |
| 1/128 | 65 | 44 | 34 | 2 |

Figure 6:
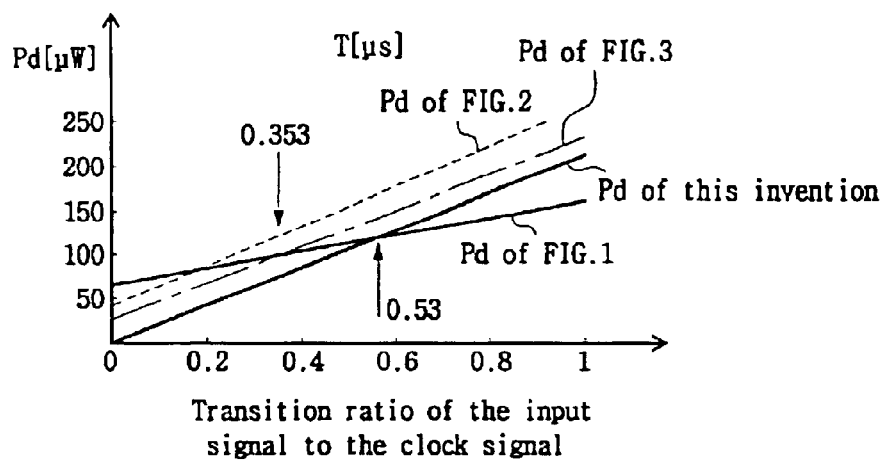
FIG. 6 is a graphic diagram showing the characteristics of power consumption in the conventional flip-flop circuits as compared with the flip-flop circuit of the present invention.

FIG. 6 graphically represents the measured values of Table 1. As may be appreciated in view of Table 1 and FIG. 6, the power consumption related to the inventive low power flip-flop circuit is significantly reduced when the variation of the input signal is small, compared to the conventional flip-flop circuits. It can also be appreciated in view of FIG. 6 that the flip-flop circuit of FIG. 4 enables appreciable reduction of power consumption when the transition ratio of the input signal with respect to the clock signal is 0.53 or less.

The low-power flip-flop circuit in accordance with the present invention is operable at a lower rate of power consumption because the clock buffer and the internal clock generating circuit do not perform switching operations when there is no or a little variation in the input signal of the flip-flop.

Although preferred embodiments of the present invention have been described in detail, it should be clearly understood that any variations and/or modifications of the basic inventive concepts as described that would be evident to those skilled in the art will still fall within the spirit and scope of the present invention, as defined in the appended claims.

What is claimed is:

1. A low power flip-flop circuit comprising:

a latch that receives and holds an input signal responsive to an internal clock signal;

a comparing circuit that compares the input signal with an output signal of the latch to provide a comparison signal indicative thereof; and an internal clock generating circuit that receives an external clock signal and generates the internal clock signal under control of the comparison signal, wherein the internal clock generating circuit controls passing of the external clock signal responsive to the comparison signal, delays the external clock signal for a predetermined time, inverts the delayed external clock signal, and generates the internal clock signal as having a pulse width smaller than a pulse width of the external clock signal by performing a NAND operation on the external clock signal and the inverted delayed external clock signal, the internal clock signal having rising and falling edges which are all synchronized with the external clock signal.

2. The low power flip-flop circuit according to claim 1, wherein the internal clock generating circuit comprises:

an inverter that inverts the comparison signal as provided at a first node and transmits the inverted comparison signal to a second node;

a transmission gate, having a first input terminal connected to the first node and a second input terminal connected to the second node, that receives the external clock signal and passes the external clock signal to a third node;

a PMOS transistor having a source terminal connected to a supply voltage, a gate terminal connected to the second node, and a drain terminal connected to the third node;

a delay circuit, having an input coupled to the third node, that delays the passed external clock signal for the predetermined time to provide the delayed external clock signal, and that inverts the delayed external clock signal to provide the inverted delayed external clock signal; and a NAND circuit that performs the NAND operation on the external clock signal and inverted delayed external clock signal.

3. The low power flip-flop circuit according to claim 2, wherein the delay circuit is comprised of an odd number of inverters.

4. The low power flip-flop circuit according to claim 2, wherein the PMOS transistor maintains the third node at a high level when the transmission gate is turned off.

5. A flip-flop circuit comprising:

a latch that receives and holds an input signal responsive to an internal clock signal;

a comparison circuit that compares the input signal to an output of said latch and provides a comparison signal indicative thereof; and an internal clock signal generator including a transmission gate, having an input coupled to the external clock signal, that is switchably responsive to the comparison signal to selectively provide the external clock signal as a transmission gate output signal at a gate output terminal, an inverter circuit, coupled to the gate output terminal, that delays and inverts the transmission gate output signal to provide an inverter output signal, and a logical gate that performs a logical operation on the external clock signal and the inverter output signal to provide the internal clock signal.

6. The flip-flop circuit of claim 5, wherein said internal clock signal generator further comprises a switch that selectively couples a supply voltage to the gate output terminal responsive to the comparison signal.

7. The flip-flop circuit of claim 6, wherein the switch is a PMOS transistor having a gate terminal coupled to the comparison signal, a source terminal coupled to the supply voltage and a drain terminal coupled to the gate output terminal.

8. The flip-flop circuit of claim 5, wherein the inverter circuit comprises a plurality of inverters connected together in series.

9. The flip-flop circuit of claim 8, wherein the inverter circuit comprises an odd-number of inverters.

10. The flip-flop circuit of claim 5, wherein the logical gate provides the internal clock signal as having pulse width smaller than pulse width of the external clock signal and as having rising and falling edges synchronized with the external clock signal.

11. The flip-flop circuit of claim 5, wherein the logical operation is a NAND logical operation.

* * * * *